United States Patent
Roth

[11] Patent Number: 6,146,724
[45] Date of Patent: Nov. 14, 2000

[54] ONE ATMOSPHERE UNIFORM GLOW DISCHARGE PLASMA COATING WITH GAS BARRIER PROPERTIES

[75] Inventor: John Reece Roth, Knoxville, Tenn.

[73] Assignee: The University of Tennessee Research Corporation, Knoxville, Tenn.

[21] Appl. No.: 08/935,752

[22] Filed: Sep. 23, 1997

Related U.S. Application Data

[63] Continuation-in-part of application No. 08/254,264, Jun. 6, 1994, Pat. No. 5,669,583.
[51] Int. Cl.[7] ........................................................ B32B 1/08
[52] U.S. Cl. ..................... 428/34.2; 428/34.3; 428/34.7; 428/35.3; 428/35.7; 428/336; 428/451; 428/452
[58] Field of Search ................................... 428/34.2, 34.3, 428/35.3, 35.7, 34.7, 336, 446, 451, 452

[56] References Cited

U.S. PATENT DOCUMENTS

| | | | |
|---|---|---|---|
| 4,552,791 | 11/1985 | Hahn | 428/35 |
| 4,702,963 | 10/1987 | Phillips et al. | 428/426 |
| 5,508,075 | 4/1996 | Roulin et al. | 428/35.7 |

*Primary Examiner*—D. S. Nakarani
*Attorney, Agent, or Firm*—Steve Mendelsohn

[57] ABSTRACT

A laminate which includes a barrier layer of OAUGDP bonded silicon oxide and a cellulosic or thermoplastic base layer. A process for applying same. A package container which includes the laminate.

9 Claims, 3 Drawing Sheets

ONE ATMOSPHERE UNIFORM GLOW DISCHARGE PLASMA COATING WITH GAS BARRIER PROPERTIES

RELATED APPLICATIONS

This is a continuation in part of allowed patent application Ser. No. 08/254,264 filed Jun. 6, 1994 to be issued as U.S. Pat. No. 5,669,583 on Sep. 23, 1997 entitled Method and Apparatus For Covering Bodies With a Uniform Glow Discharge Plasma and applications thereof, which patent application is incorporated by reference herein in its entirety.

BACKGROUND OF THE INVENTION

1. Field of the Invention

The parent application relates to methods for treating a work piece with a One Atmosphere Uniform Glow Discharge Plasma (OAUGDP), and the work piece so obtained.

2. Description of the Related Art

The OAUGDP is a very useful technology to modify substrates to impart to the substrates desirable properties. Basic information on plasma physics and the physical processes important in industrial plasma is found in Industrial Plasma Engineering, Vol. 1, J. Reece Roth, 1995, (Institute of Physics Publishing, Bristol and Philadelphia, Pa.). Low power plasmas known as dark discharge coronas have been widely used in the surface treatment of thermally sensitive materials such as paper, wool and synthetic polymers such as polyethylene, polypropylene, polyolefin, nylon and poly (ethylene terephthalate). Because of their relatively low energy content, corona discharge plasmas can alter the properties of a material surface without damaging the surface.

Glow discharge plasmas represent another type of plasma, the relatively low power densities of which are useful for non-destructive material surface modification. However, glow discharge plasmas have heretofore been successfully generated typically in low pressure or partial vacuum environments below 10 Torr. Such plasma deposition, as by chemical vapor deposition under vacuum requires batch processing, expensive vacuum equipment and is of limited versatility.

Low pressure or vacuum electrical discharges should be distinguished from low power density filamentary plasmas at one atmosphere which have been used for ozone production. Such plasmas are not satisfactory for the treatment of substrates, in particular because unlike the OAUGDP, they do not treat the substrates evenly and tend to damage the surface of the substrate. OAUGDP, in contrast, has none of these disadvantages and has important technical and economic advantages of particular interest for the present invention.

The present invention deals with the treatment of a substrate with OAUGD to render the substrate impervious to oxygen with a coating of silicon oxides. Particularly, the invention deals with substrates like plastics and paper laminates designed for food containers.

For background patents of interest, the following patents may be consulted: U.S. Pat. No. 5,403,453, Method and Apparatus For Glow Discharge Plasma Treatment of Polymer Materials at Atmospheric Pressure, Roth et al., 1995; U.S. Pat. No. 5,414,324, One Atmosphere, Uniform Glow Discharge Plasma, Roth et al., 1995; U.S. Pat. No. 5,387,842, Steady-State, Glow Discharge Plasma, Roth et al., 1995; U.S. Pat. No. 5,456,972, Method and Apparatus For Glow Discharge Plasma Treatment of Polymer Materials at Atmospheric Pressure, Roth et al., 1995; U.S. Pat. No. 5,508,075, Packaging Laminate With Gas and Aroma Barrier Properties, Roulin et al., 1996; U.S. Pat. No. 5,133,999, Packaging Material of Laminate Type, Lofgren et al. 1992; U.S. Pat. No. 4,495,016, Method of Making a Packing Laminate Web, Viberg et al., 1985; U.S. Pat. No. 5,224,441, Apparatus for Rapid Plasma Treatments and Method, Felts et al. 1993; and, U.S. Pat. No. 5,506,036, Easy-to-Recycle Laminated Material For Packaging Use, Bergerioux, 1996, all of which are incorporated herein by reference.

In prior art processes utilizing PECVD, the plasma is formed in an enclosed reaction chamber in which the substrate is positioned and from which the air is evacuated until a high vacuum is achieved. A substrate thin film may be repeatedly moved back and forth within the plasma reaction chamber in order to deposit multiple layers on the substrate. When this is accomplished, the substrate is removed from the deposition chamber, and another batch of substrate is introduced into the chamber and the operation is repeated, thus typically operating the PECVD by batch processing. Another shortcoming of the PECVD is that the substrate must be a vacuum compatible material. See, U.S. Pat. No. 5,888,199, Plasma Thin Film Deposition Process, Felts et al, 1989.

U.S. Pat. No. 5,508,075 to Roulin et al. relates to a laminate having a substrate on which a layer of silicon oxides is applied by chemical plasma vapor deposition under vacuum. The plasma enhanced chemical vapor deposition (PECVD) method to deposit $SiO_x$ on packaging substrates is a development in response to the practice common in the United States, Europe and elsewhere in the world to provide packaging laminates, for instance for the manufacture of cartons for liquid, like milk or fruit juice, with a layer of aluminum foil to minimize the penetration of oxygen into the carton and the degradation of the flavor oils or the loss of flavor or color from the package. However, aluminum will not be acceptable any longer in areas when and where environmental regulations prohibit its use and disposal.

The present invention is an improvement over the known technique of PECVD of silicon oxides on a substrate.

SUMMARY OF THE INVENTION

The present invention relates to a method for reducing the gas-permeability, especially the oxygen-permeability of a gas-permeable substrate such as paper, cardboard or plastic. The present invention relates particularly to packaging laminates which have all the advantages of the prior art, and other advantages because the laminates are manufactured by OAUGDP and the machinery is operated at one atmosphere, as opposed to under vacuum. The present invention especially relates to packaging laminates treated with silicon oxides for containers, especially for solid or liquid food products.

The method of the invention comprises exposing the substrate to be treated in a confined environment (or chamber) which comprises a silicon-based feed gas like silane, or vaporized organic silicon compound, e.g., tetramethyl disiloxane (TMDSO) or hexamethyldisiloxane (HMDSO), an inert gas (e.g., argon or helium) and oxygen gas where a plasma is generated and the vaporized silicon compound reacts with oxygen to form the silicon oxides which are deposited on and chemically bonded to a selected substrate positioned in the chamber.

The substrate can be, and will usually be continuously fed into and removed from the chamber, thus operating the OAUGDP on a continuous basis, as opposed to batch processing.

The invention also includes the silicon oxide treated substrates of reduced gas-permeability, ideally gas-impermeable, for applications for laminates for food packaging and others where such a laminate is useful.

In accordance with the present invention, the silicon oxide layer formed by OAUGDP has all the properties necessary for a packaging material, such as being able to withstand substantial elongation without rupture and to be deformed without rupture during the manufacture of the package.

The thin silicon oxide layer formed by OAUGDP is especially useful in packaging liquid food products.

When cellulosic substrates are treated in accordance with the invention, the silicon oxide can penetrate the pores of the substrate, thereby creating a highly effective oxygen barrier.

For food packaging applications, the thickness of silicon oxide film is generally 100 Å to about 400Å (0.0004 mils to about 0.0016 mils) and the thickness of the substrate is about 0.5 to 1 mil for food packaging applications. For general applications, the silicon layer applied by OAUGDP is generally of a thickness between 50 Å and 500 Å. The thickness of the silicon layer applied by OAUGDP can vary outside of these limits, as from 10 Å (1 nm) to 2500 Å (250 nm).

The method and products are described in greater detail hereinafter.

BRIEF DESCRIPTION OF THE DRAWINGS

Preferred embodiments of the present invention are illustrated in the accompanying drawings in which.

DETAILED DESCRIPTION OF THE PREFERRED EMBODIMENT

Figure 1:
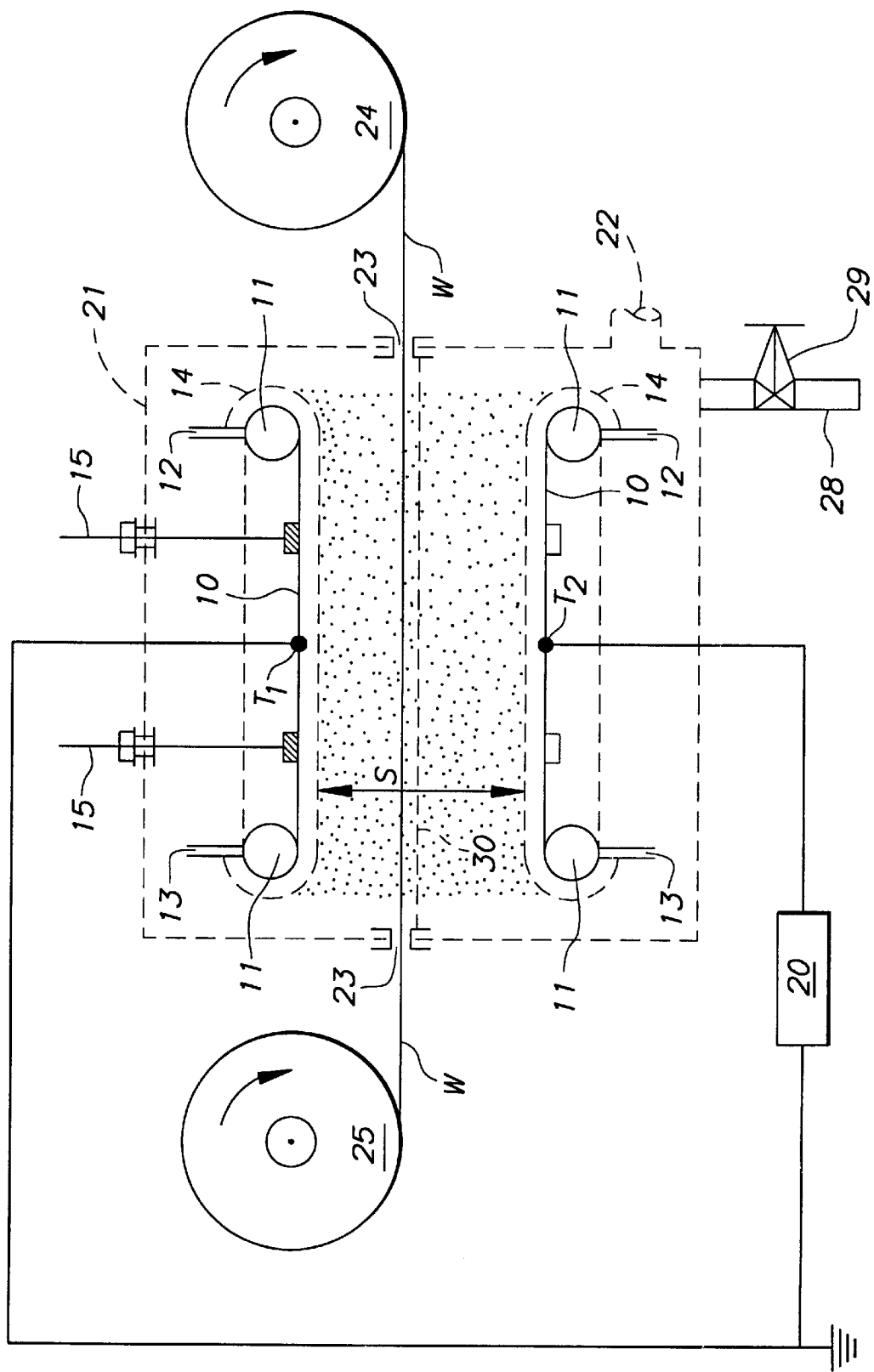
FIG. 1 is a schematic of the assembly of the invention for the generation of OAUGDP and application of silicon oxides to a substrate like paper or a thermoplastic like polyethylene (PE).

Referring to the invention schematic illustrated by FIG. 1, the electrodes 10 are fabricated of an electrical conductor having a representative square plan dimension of 25 cm×25 cm. Silver soldered to the plates 10 are closed loops 11 of 1.9 cm metal tubing having hose nipples 12 and 13 connected therewith on opposite sides of the closed tubing loop. Not shown are fluid flow conduits connected to the inlet nipples 12 for delivering coolant fluid to the loop 11 and to the outlet nipples 13 for recovering such coolant fluid. The integral metallic units comprising plates 10 and tubing 11 are covered with a high dielectric insulation material 14. Preferably, a mechanism is be provided for adjusting the distance d between plates 10 up to about 5 cm separation while maintaining relative parallelism. Such a mechanism is represented schematically in FIG. 1 by the rod adjusters 15 secured to the upper plate 10. This arrangement anticipates a positionally fixed lower plate 10. Energizing the plates 10 is a low impedance, high voltage, R.F. power amplifier 20 having independently variable voltage and frequency capacities over the respective ranges of 1 to at least 15 KV and 1 to 20 KHz. Surrounding the plate assembly is an environmental isolation barrier 21 such as a structural enclosure suitable for maintaining a controlled gas atmosphere (the inert gas, the silicon generating compound and the oxygen) in the projected plan volume between the plates 10. Inlet port 22 is provided to receive an appropriate species generating gas, preferably a feed gas capable of acting as the source of the silicon oxide, and possibly also an inert gas. The gaseous source of the silicon oxide may be fed through the same inlet port 22 or from a different inlet (not shown). In any case, gas pressure within the isolation barrier 21 is substantially ambient, thereby obviating or reducing the need for gas tight seals. Normally, it is sufficient to maintain a low flow rate of the modified one atmosphere gas through the inlet port 22 that is sufficient to equal the leakage rate. Since the pressure within the isolation barrier 21 is essentially the same as that outside the barrier, no great pressure differential drives the leakage rate. A vent conduit 28 controlled by valve 29 is provided as an air escape channel during initial flushing of the enclosure. Thereafter, the valve 29 is closed for normal operation.

Material flow slits 23 are provided in the isolation barrier 21 to accommodate continuous passage of the substrate (a web or film) to be treated between the plates 10 as drawn from a supply reel 24 onto a rewind reel 25. Drive for the reels 24 and 25 is controlled to provide a predetermined residence time between the plates 10 and within the plasma for the substrate, e.g. the plastic or the cellulosic material to be coated.

Thus, the OAUGDP operates on a continuous basis. Furthermore, adjustments can readily be made to residence time, compositon of the gas(es), etc., without interrupting the passage of the substrate.

Another realization of the OAUGDP is to generate the thin film barrier coating chemical precursors in the plasma reactor remote from the deposition site and then conduct and provide the precursor active species to the substrate, thereby depositing the film on the substrate on a location separate from the plasma chamber. The "remote generation and exposure" variant of OAUGDP has the added advantage of avoiding exposure of the substrate to the plasma, thereby permitting the treatment of substrates that heretofore could not readily be treated in this manner because of their sensitivity to ultra violet light or other plasma influences. The variant can be readily illustrated in a modification of FIG. 1 in which Reels 24 and 25 together with a support for the substrate, if desired, be positioned away from the plasma chamber 21, an outlet for the generated active species provided from that chamber to the location (another confined environment) where the substrate is positioned. Conceivably, in such embodiment of the OAUGDP, the plates 10 need not any longer be in relative parallelism but can take an appropriate geometric configuration.

Residence or exposure time can be varied depending on the thickness of the silicon oxide layer to be deposited on the substrate. Generally 1 to 10,000 milliseconds are suitable with an exposure time of 2,000 to 5,000 milliseconds being generally satisfactory.

In operation, some food products, such as beer, mayonnaise or orange juice, lose their nutritional value due to the penetration of oxygen through the wall of the carton. The color of certain foods will also be affected by light.

The compound which is the source for the silicon oxide layer to create the oxygen barrier coating on the substrate can be selected from a variety of organic silicon compounds. The compounds are generally liquid at about ambient temperature and when volatized have a boiling point above ambient temperature. These compounds include alkyl-, aryl-silane (wherein the alkyl is of 1 to 12 carbons and the aryl is of 6 to 10 carbons), methylsilane, dimethylsilane, trimethylsilane, diethylsilane, like propylsilane, phenylsilane, hexamethyldisilane, 1,1,2,2-tetramethyl disilane, bis(trimethylsilyl) methane, bis(dimethylsilyl) methane, hexamethyldisiloxane, vinyl trimethoxy silane, ethyltrimethoxy silane, divinyltetramethyldisiloxane, divinylhexamethyltrisiloxane, and trivinylpentamethyltrisiloxane or halqgen-containing silanes like $S_1X_xY_y$ wherein X is chlorine, bromine or iodine, and x+y is 4, like dichlorosilane, silicon tetrachloride; or the hydride silane ($SiH_4$) and other equivalents generating a silicon molecule.

The oxygen component of the gas can be any volatile oxidant like oxygen or air, or molecules containing oxygen and nitrogen, sulfur, like $NO_2$, $CO_2$, $SO_2$, etc. or carbon or sulfur. The inert gas is preferably helium or argon.

By regulating the quantity of oxygen in the gas mixture which is fed into the confined environment, it is possible to control the chemical reaction within the environment in such a manner that the thus-formed silicon oxide assumes the chemical formula $SiO_x$ in which x may vary from a value of less that 1.5 to values far in excess of 2.5. The chemical reaction can be controlled such that x is preferably in the range of between 1.5 and 2.2, which has been shown to be that range within which the formed silicon oxide compound displays optimum properties as regards oxygen gas and aroma barrier and other properties valuable for the packaging laminate.

The compound which will generate the silicon oxide will be introduced with or separately from the other gaseous component into the confined environment where it will be vaporized and bonded onto the substrate.

It is not necessary that the silicon generating source be fed as a gas. It can be provided as a liquid which with an appropriate rise in temperature at atmospheric pressure will generate the necessary gas for deposit of the silicon species.

The thus-formed silicon oxide layer on the substrate will, from the barrier viewpoint, be high such that the silicon oxide layer can be made very thin without any loss of the desired barrier properties. The preferred substrates are flexible thermoplastic materials, such as polyethylene, polypropylene or polyethylene or polyethylene terephthalate (PET).

In accordance with the invention, the silicon oxide layer can also be applied to other substrates that constitute the packaging laminate, in particular, cellulosic materials like paper, cardboard and paperboard, to which the $SiO_2$ layer was not applied by prior packaging technology.

The silicon oxide film is hard, scratch-resistant, optically clear and adheres well to flexible substrates and non-flexible substrates like glass, ceramic, metal, thermoset plastics, cloth (nonwoven or woven), and others.

The thickness of the deposited silicon oxide layer can be from a few nanometers such as 5 nanometers to a few hundred nanometers such as 500 or more nanometers. When a porous substrate like a cellulosic material is selected, the silicon oxide will penetrate the pores of the substrate.

The time required to deposit the silicon oxide barrier film will normally not exceed a few seconds, and generally can be as little as a few milliseconds for an oxygen barrier coating of a few tens of nanometers e.g., 20 to 50 nanometers. An advantage of the OAUGDP deposition over the vacuum deposition is the corresponding greater density of silicon oxide precursors available for depostion at one atmosphere on the substrate and considerably shorter times for deposit of the silicon oxide layer.

Instead of treating generally flat surfaces or substrates, the plasma deposition of an oxygen barrier such as a silicon oxide film can also be readily applied to convoluted forms such as bottles made of molded plastic, especially plastics acceptable for foods, like juices or milk, which require substrates generally impervious to oxygen.

Figure 2:
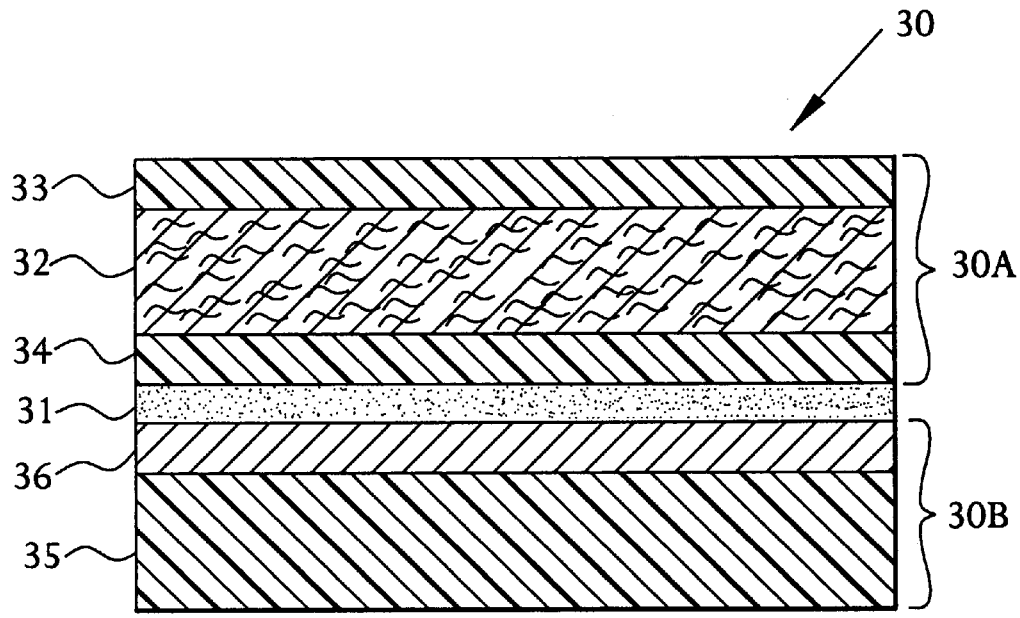
FIG. 2 schematically illustrates a packaging laminate according to an embodiment of the present invention.

As shown in FIG. 2, the laminate 30 comprises two prefabricated laminates 30a and 30b which are permanently bonded to one another by an intermediate layer 31 of an adhesive. The first laminate 30a has a rigid but foldable core layer of paper or paperboard 32 and two outer layers of low density polyethylene (LDPE) 33 and 34, which are heat-sealable.

In order to utilize the $SiO_x$ barrier layer produced in the plasma OAUGDP process as a packaging laminate for food products, certain additional layers are normally included.

Figure 3:
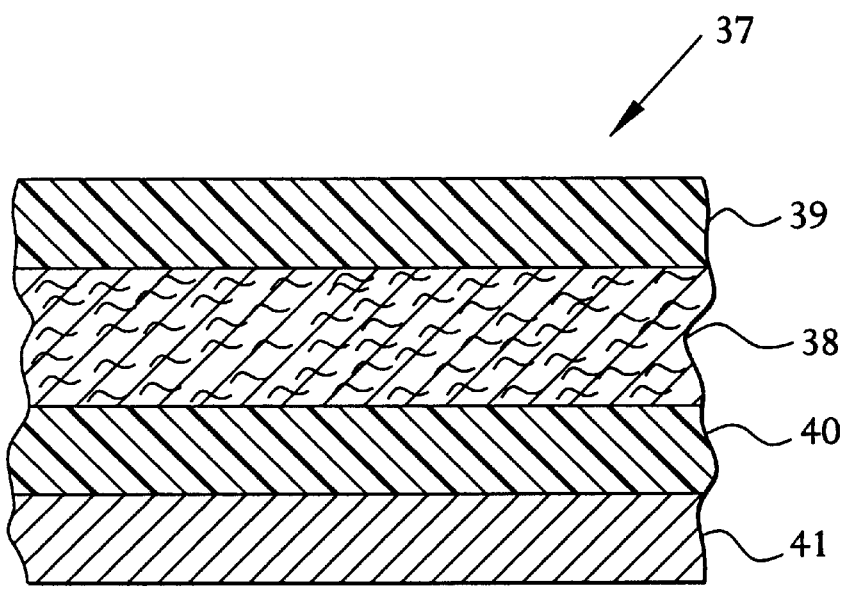
FIG. 3 schematically illustrates a packaging laminate according to another embodiment of the present invention.

FIG. 3 shows an embodiment in which the $SiO_x$ layer is in direct contact with the product in the interior of the package. In this embodiment, the packaging laminate 37 includes a base layer 38, which may be any suitable material that is flexible, such as paper, foam core, PET, polyamide, polyethylene, or polypropylene. The exterior side of the base layer 38 is coated with an LDPE layer 39. On the interior side of the base layer, a layer of LDPE 40 has a thin coating 41 of $SiO_x$, as described above with respect to the layers 35 and 36 of FIG. 2. The LDPE layer 40 may be bonded to the base layer by a suitable adhesive.

Since the $SiO_x$ coating or layer 41 is exposed on the interior side of the laminate, when the laminate is folded and heat-sealed to form a container, the $SiO_x$ layer 41 will be in direct contact with the contents of the container. When the laminate is used for food product containers, the $SiO_x$ layer 41 is an acceptable material for this purpose, since it would have no deleterious effect on the food contents. Due to the thinness of the $SiO_x$ layer 41, a strong heat seal bond can be formed between the exterior layer 39 and the interior layer 40 when the laminate is folded and formed in conventional packaging machines at a heat sealing temperature of between 250° F. and 500° F. Another way to form a bond using the packaging laminate 37 is to employ ultrasonic heating which causes softening of the LDPE layer 40 without requiring the transmission of heat through the $SiO_x$ layer 41. Alternatively, if the package is formed in such a manner that the layer 41 is heat-sealed to itself, it would not be necessary for the layer 39 to be heat-sealed.

As an example of a preferred packaging laminate in accordance with the embodiment in FIG. 3, the exterior LDPE layer should have a thickness of about 15 microns and the interior LDPE layer should have a thickness of about 15 microns. The base layer 38, if present, should have a thickness of between 15 microns and 200 microns. The $SiO_x$ layer 41 should have a thickness of between 50 and 500 Å. A laminate having layers of these thickness will have good barrier properties and will be capable of being formed into packages by heat-sealing without causing holes or tears that might cause the package to leak.

Figure 4:
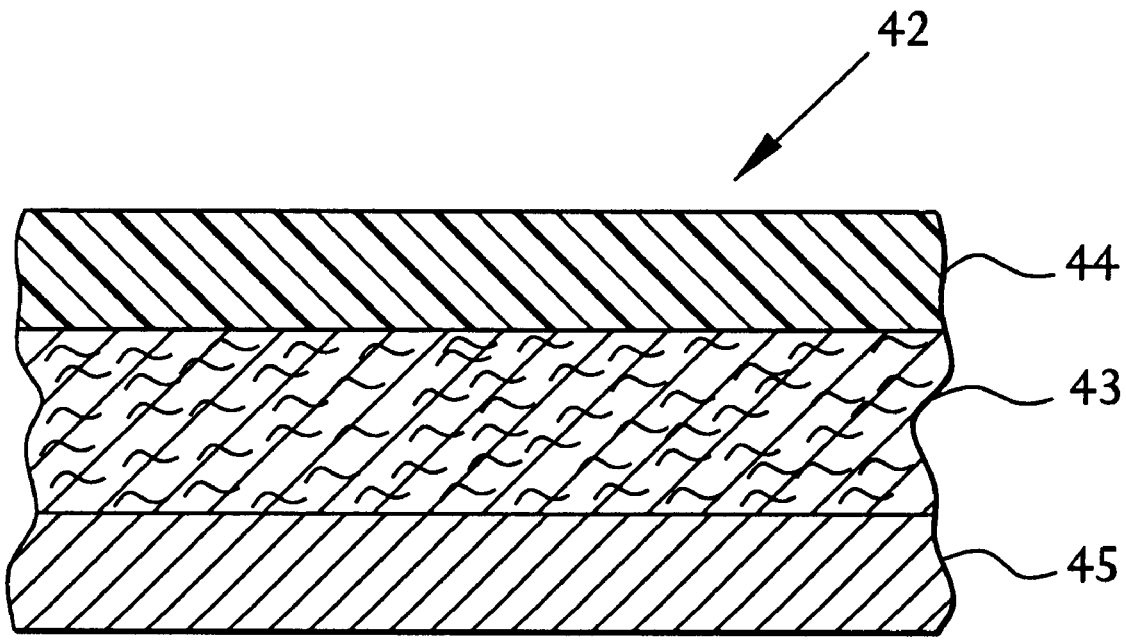
FIG. 4 schematically illustrates a packaging laminate according to yet another embodiment of the present invention.

FIG. 4 shows another embodiment in which the $SiO_2$ layer is one side in direct contact with the product in the interior package and on the other side, in direct contact with base layer 43, that is, a cellulosic material-like paper, which may but need not be grease-proof paper.

In a further embodiment (not shown), the silicon oxide layer is positioned inside the laminate (as shown in FIG. 3) but in contact with a base layer of a cellulosic material, like paper. The cellulosic material may be a non-woven or woven web.

In the description, the terminology "core layer" has been used to designate a layer of cellulosic material like paper or paperboard, a "barrier" layer which typically in the prior art, is layered aluminum and in the present invention, is silicon oxide, and an "inner layer" which normally, but not always, is a product contact layer, like of LDPE. A laminate may include one or more of any one of these layers.

While this invention has been illustrated and described in accordance with several preferred embodiments, it should be recognized that variations and changes may be made without departing from the invention as set forth in the claims.

What is claimed is:

1. A laminate which comprises a silicon oxide barrier layer formed from a one atmosphere uniform glow discharge plasma (OAUGDP), having an average thickness greater than about 100 nanometers (nm), and a cellulosic or thermoplastic base layer, in which the barrier layer inhibits gas permeability, resists impact, and resists abrasion, wherein the laminate is folded and heat-sealed to form a container, such that the barrier layer is on the interior of the container.

2. The laminate of claim 1 in which the average thickness of the barrier layer is from about 100 to about 5,000 nm.

3. The laminate of claim 2 in which the average thickness of the barrier layer is from about 500 to about 2,000 nm.

4. The laminate of claim 2 in which the barrier layer is deposited on the base layer within 1 to 10,000 milliseconds.

5. The laminate of claim 4 which comprises at least one additional layer of thermoplastic, wherein the base layer is between the barrier layer and the additional layer of thermoplastic.

6. The laminate of claim 1, wherein the barrier layer is bonded to the thermoplastic base layer.

7. The laminate of claim 1, wherein the barrier layer is resistant to oxygen gas.

8. A packaging container which comprises a laminate which comprises a silicon oxide barrier layer formed from a one atmosphere uniform glow discharge plasma (OAUGDP), the barrier layer having an average thickness of greater than about 100 nm, and a cellulosic or thermoplastic base layer and at least one additional layer of thermoplastic, wherein the base layer is between the barrier layer and the at least one additional layer of thermoplastic and the barrier layer provides a barrier against oxygen gas penetrating into the package, and provides resistance to impact and abrasion, wherein the laminate is folded and heat-sealed to form the packaging container, such that the barrier layer is on the interior of the container.

9. The packaging container of claim 8, wherein the barrier layer is resistant to oxygen.

* * * * *